Figure 1:
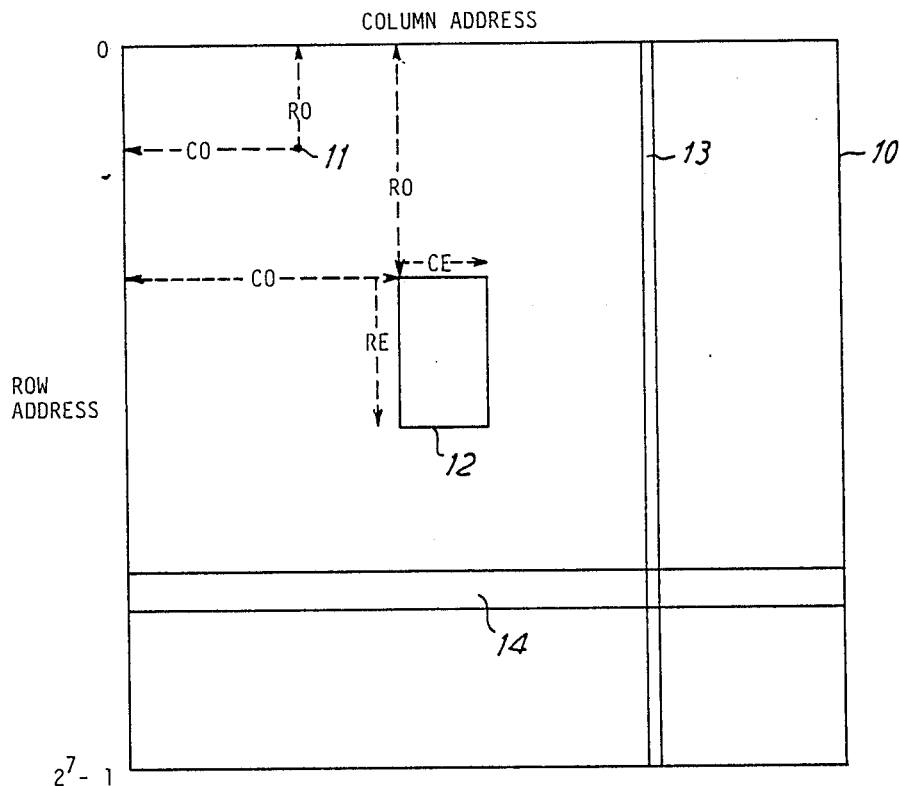

United States Patent [19]

MacDonald

[11] Patent Number: 4,868,789
[45] Date of Patent: Sep. 19, 1989

[54] RANDOM ACCESS MEMORY SYSTEM WITH CIRCUITRY FOR AVOIDING USE OF DEFECTIVE MEMORY CELLS

[75] Inventor: Neal MacDonald, Haddenham, United Kingdom

[73] Assignee: Anamartic Limited, Milton, England

[21] Appl. No.: 98,623

[22] PCT Filed: Dec. 12, 1986

[86] PCT No.: PCT/GB86/00760
§ 371 Date: Aug. 12, 1987
§ 102(e) Date: Aug. 12, 1987

[87] PCT Pub. No.: WO87/03716
PCT Pub. Date: Jun. 18, 1987

[30] Foreign Application Priority Data
Dec. 13, 1985 [GB] United Kingdom ............... 8530770

[51] Int. Cl.$^4$ ..................... G11C 7/00; G11C 29/00
[52] U.S. Cl. .................................. 365/200; 365/195; 365/236; 365/219; 371/7; 371/10.1; 371/11.1
[58] Field of Search ............... 365/51, 63, 200, 221, 365/220, 219, 236, 239, 195, 201; 371/10, 11, 21, 7

[56] References Cited

U.S. PATENT DOCUMENTS

| | | | |
|---|---|---|---|
| 3,913,072 | 10/1975 | Catt | 365/200 |
| 4,066,880 | 1/1978 | Salley | 365/200 |
| 4,070,651 | 1/1978 | Naden | 365/200 |
| 4,074,236 | 2/1978 | Ishida | 365/200 |
| 4,471,483 | 9/1984 | Chamberlain | 371/11 |
| 4,493,055 | 1/1985 | Osman | 365/220 |
| 4,644,539 | 2/1987 | Sato | 365/200 |
| 4,706,216 | 11/1987 | Carter | 365/103 |

FOREIGN PATENT DOCUMENTS

| | | |
|---|---|---|
| 2014767 | 8/1979 | United Kingdom . |
| 2166273 | 4/1986 | United Kingdom . |
| 2177825 | 1/1987 | United Kingdom . |
| 2178204 | 2/1987 | United Kingdom . |
| 2181870 | 4/1987 | United Kingdom . |

OTHER PUBLICATIONS

Aubusson et al, IEEE Journal of Solid-State Circuits, vol. SC-13, No. 3, Jun. 1978, "Wafer-Scale Integration-A Fault Tolerant Procedure", pp. 339-344.

Primary Examiner—Stuart N. Hecker
Assistant Examiner—Glenn A. Gossage
Attorney, Agent, or Firm—Robert F. O'Connell

[57] ABSTRACT

A digital computer can write a block of data to a RAM, or read a block therefrom, via a serial/parallel converter which is word serial, bit parallel on the computer side and bit serial on the RAM side. The RAM is addressed by a free-running address counter clocked by clock pulses WCK. A fault masking circuit enables faulty cells in the RAM to be masked out. Data specific to the RAM causes the clock pulses WCK to be selectively gated for providing bit rate clock pulses GCK to the converter. These pulses are divided down to produce pulses BCK at word rate. The invention is particularly useful in a wafer scale integrated circuit comprising a large number of RAMs served by a single fault masking circuit with tabulated data defining the memory cells to be masked out on a memory by memory basis.

15 Claims, 14 Drawing Sheets

RANDOM ACCESS MEMORY SYSTEM WITH CIRCUITRY FOR AVOIDING USE OF DEFECTIVE MEMORY CELLS

A major problem in the semiconductor industry is the occurrence of faults in integrated circuits. The larger the scale of integration, the more serious the problem. It is common practice to test chips and discard those which are faulty. This becomes very wasteful when the scale of integration is large because so many chips suffer defects that the manufacturing yield becomes unacceptably low. For this reason alternative techniques have been developed, especially in the case of integrated circuit memories. It is well known to provide redundant memory cells which can be used to replace defective cells in a manner which is transparent to the user of the memory. Disadvantages of this approach are the additional chip area occupied by the redundant cells and associated circuitry and the need to customise every defective chip individually after it has been tested to locate faulty cells.

A more specific problem which arises with dynamic RAM chips is a kind of graceful degradation as the refresh interval is increased. Long refresh intervals are very desirable because they reduce the power consumption of dynamic RAM but, as the interval is increased it is found that randomly located cells begin to fail one by one.

When integrated circuits are diced into individual chips it is always possible at the last resort to discard defective chips and it is also possible to grade the chips into different speeds. These possibilities are not available in the case of wafer scale integration and alternative techniques have had to be devised. These include an extension of the redundancy approach whereby discretionary wiring is utilised to connect into the wafer only the functional modules thereof. The modules of a wafer scale integrated circuit may be equated with undiced chips. An alternative approach which was disclosed originally in U.S. Pat. No. 3,913,072 utilises modules which incorporate configuration logic and can be commanded to grow a chain of good modules. A reiterated test and growth procedure rejects defective modules and adds good modules one by one to the chain. This has the great advantage that no expensive customising of the wafer scale circuit is needed. The chain of good modules is grown under software control and it is readily possible to grow the chain afresh every time the circuit is powered. Equally, it is possible to store information defining the commands which are used in growing a good chain, e.g. in an ROM on the wafer or off the wafer or in external storage such as a disc. The technique of this prior art is nevertheless only a partial solution. Any modules which are excluded from the chain represent wasted silicon area. If the modules themselves are complex, there is a significant risk that a large proportion of modules will suffer from defects. Moreover, the larger the number of defective modules, the less efficient is the chain growing process. The efficiency may be defined as the proportion of modules which are good which are actually incorporated in the chain. If the chain is forced to avoid a significant proportion of bad modules, it will also fail to include significant numbers of good modules.

In systems wherein configuration logic is commanded to grow the modules into a long chain (often called a spiral because of a typical growth pattern) which avoids defective modules, a simple bus structure is essential; otherwise the configuration logic has to switch too many connections. In proposals of this kind, e.g. U.S. Pat. No. 3,913,072, shift registers have been contemplated as the memory devices. The chain of modules becomes a very large shift register. A disadvantage of such an arrangement is the long average latency in accessing data. Another disadvantage is that any fault in a shift register corrupts all data. For this reason it is already known in large scale integrated circuits to use a random-access memory (RAM) addressed by a free-running address counter as a replacement for a large shift register. RAM faults only affect data locally.

If the known redundant cell techniques were to be applied to such a system, the customizing of each wafer would represent a major and costly overhead. The object of the present invention is to provide a more satisfactory and very flexible solution to the problems discussed above.

The invention is defined with particularity in the appended claims. Briefly, the idea is to provide a control arrangement which treats the bit stream to or from a RAM addressed by a free-running counter as non-existent during selected clock periods or groups of clock periods. Defective cells or areas of the RAM are thus skipped over and RAM faults are masked. The information determining which clock periods or group of clock periods are selected for such treatment can be stored in a table in software or firmware and no customizing of the RAM itself is necessary. The table can hold information individual to each module in a WSI implementation.

There are many different ways in which the information can be set up. For example, a single cell can be identified by the number of clock pulses it is distant from the address counter datum count value or by its row and column address values in a RAM addressed by row and column. As another example, a rectangular area of arbitrary size in a RAM addressed by row and column can be identified by start and finish row address values and start and finish column address values, or by start row and start column address values plus row and column extent values.

It is an inevitable consequence of the technique of the invention that the apparent or usable size of a RAM is less than its physical size. There are various ways of accommodating this discrepancy. The RAM may be given excess physical size so that, up to a certain level of incidence of faults, it will be capable of providing a predetermined, standard usable size. This represents another kind of redundant cell technique but without the need to customise the RAM itself. An alternative technique is to provide a RAM management system which accommodates to RAM modules of varying sizes.

Figure 2:
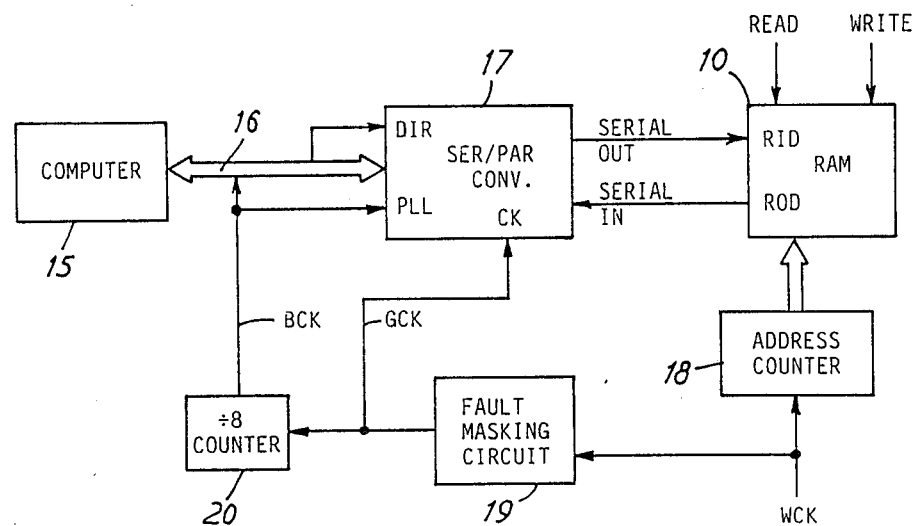
Figure 3:
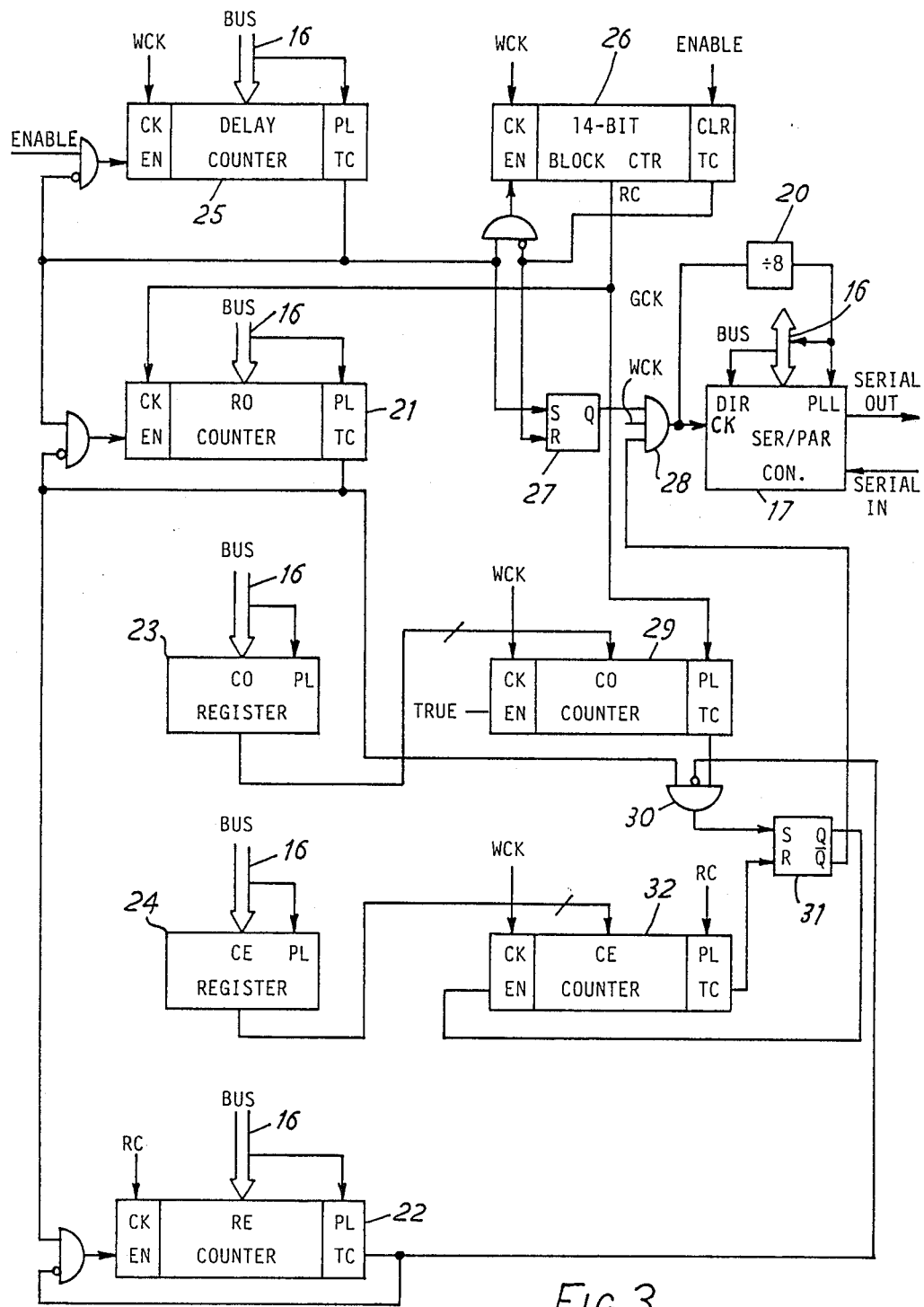
Figure 3A:
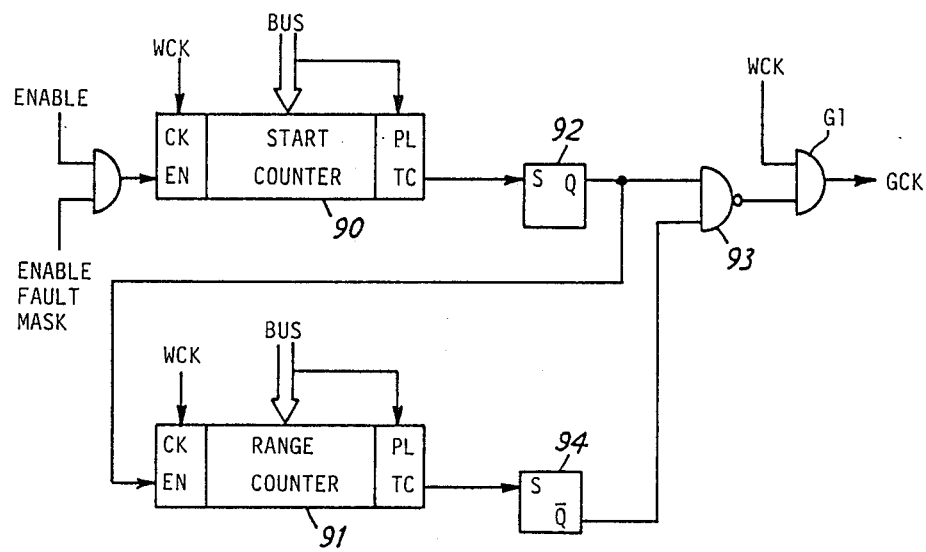
Figure 4:
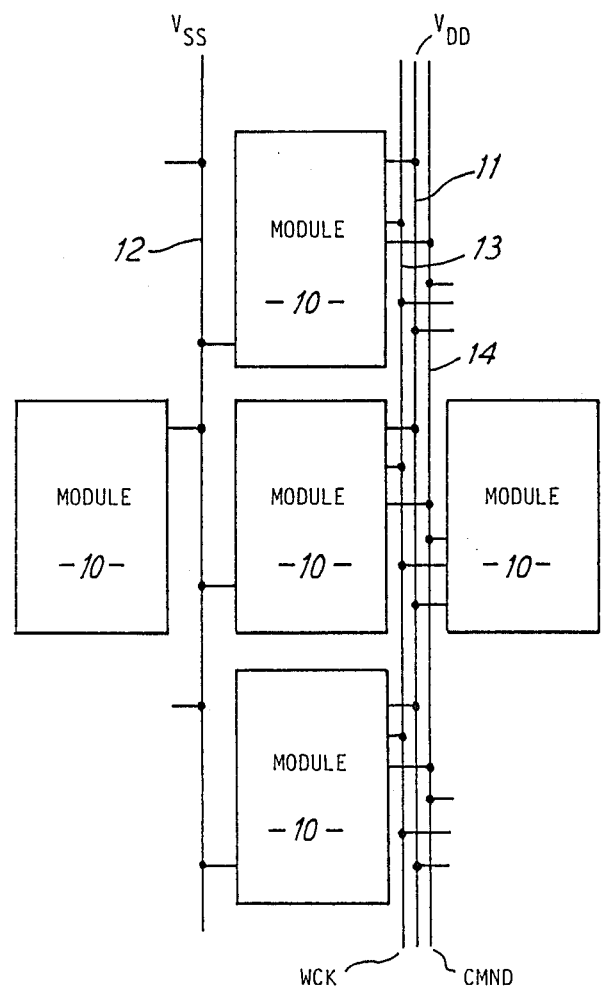
Figure 5:
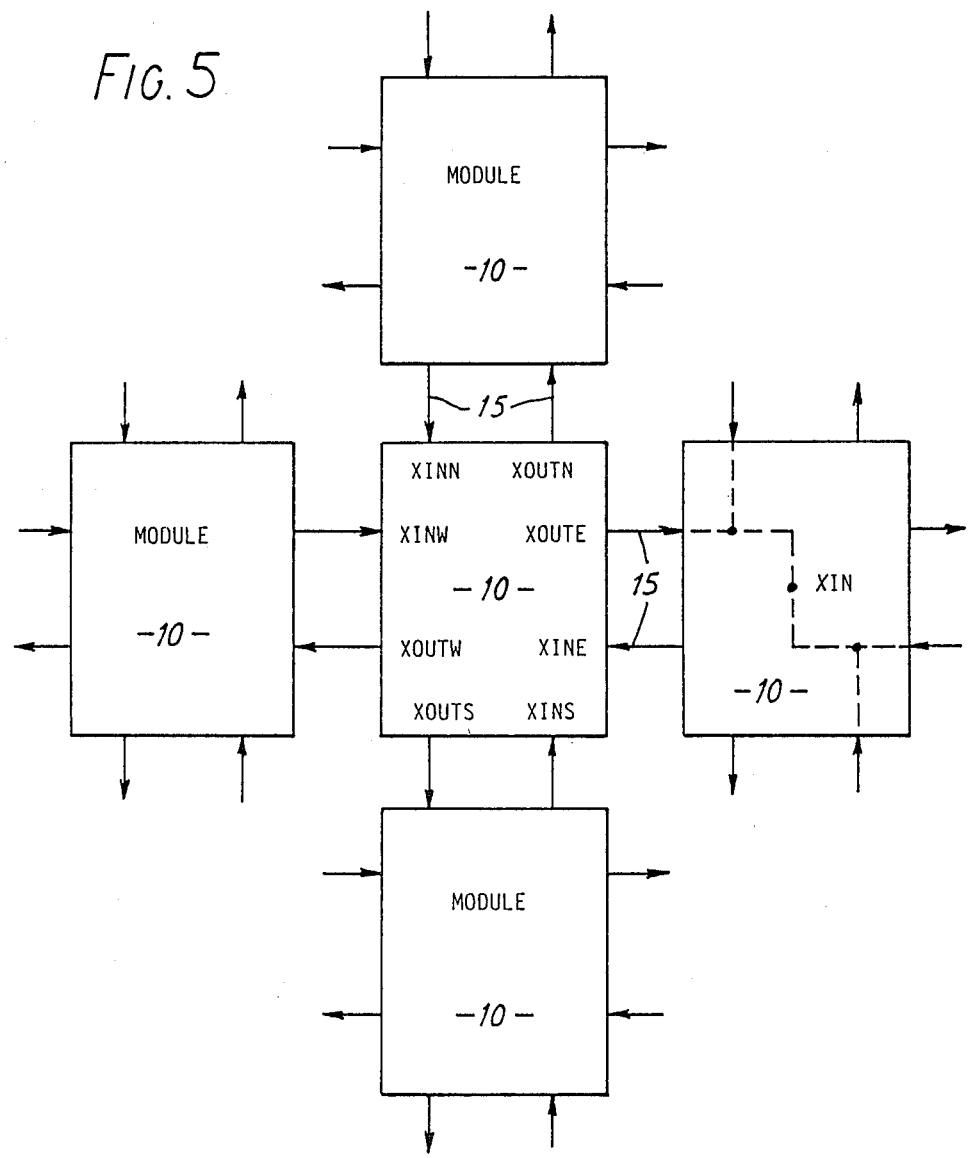
Figure 6:
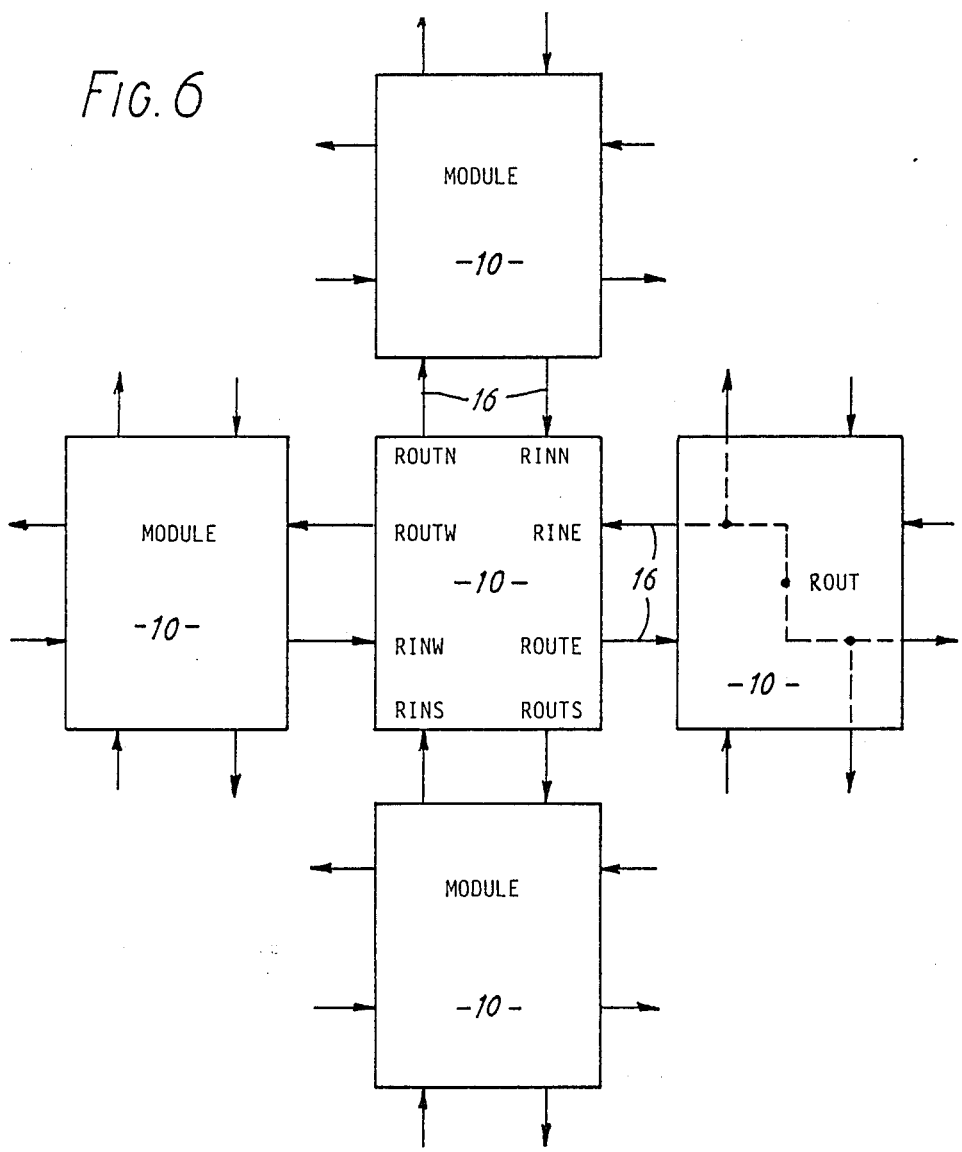
Figure 7:
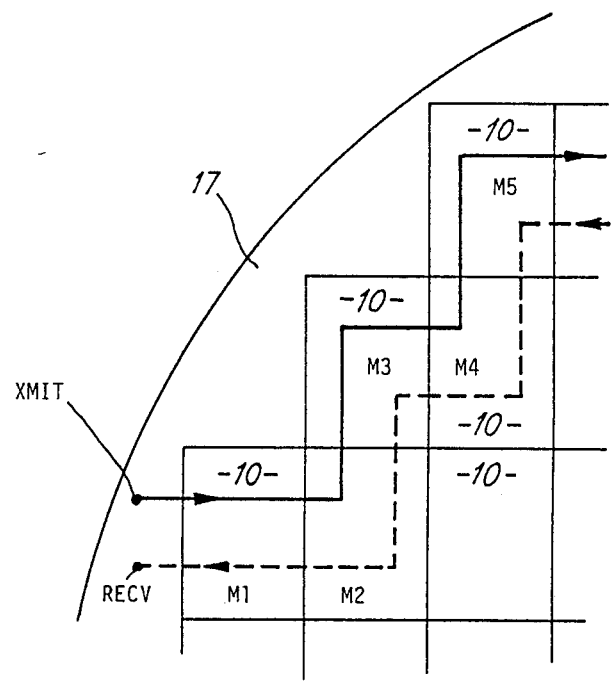
Figure 8:
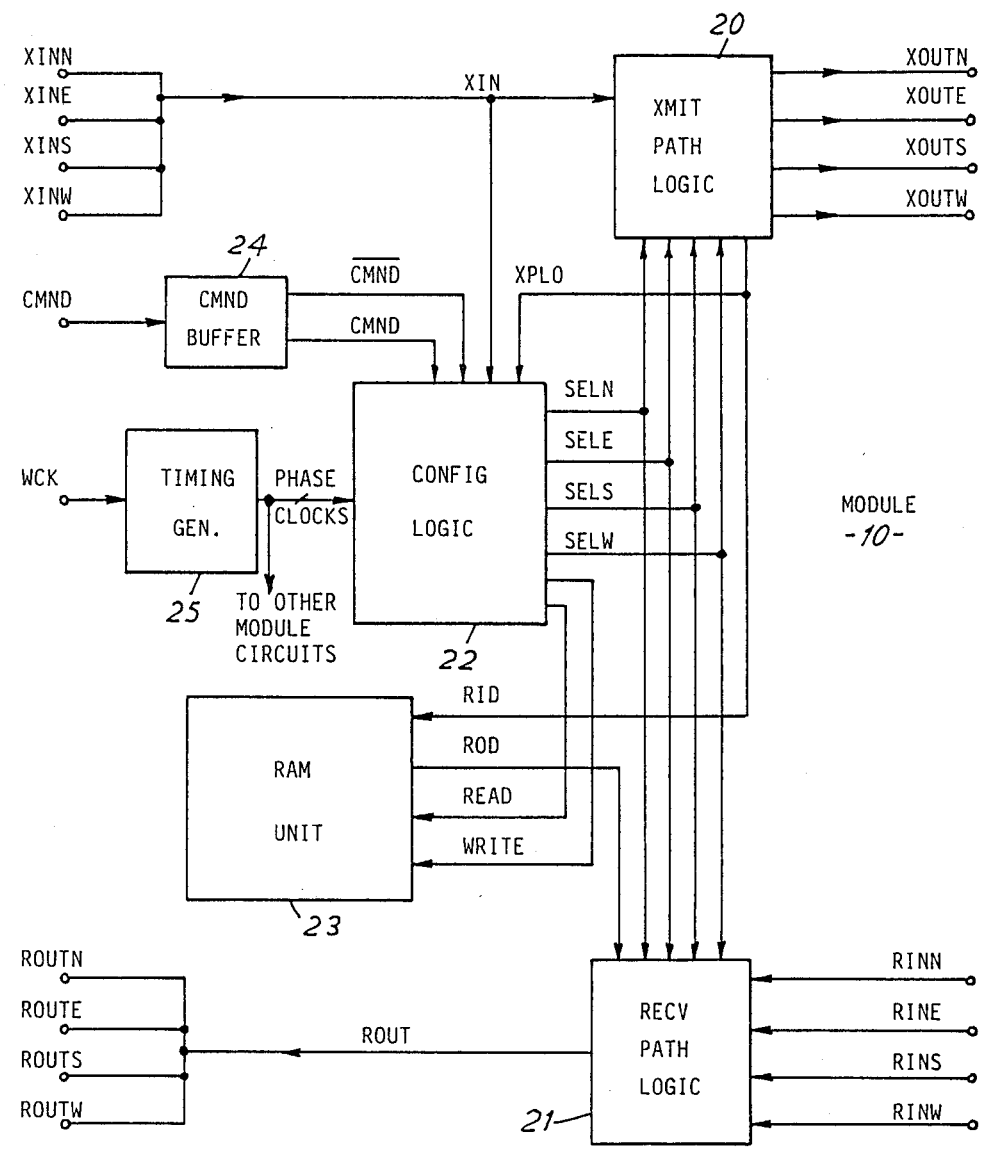
Figure 9:
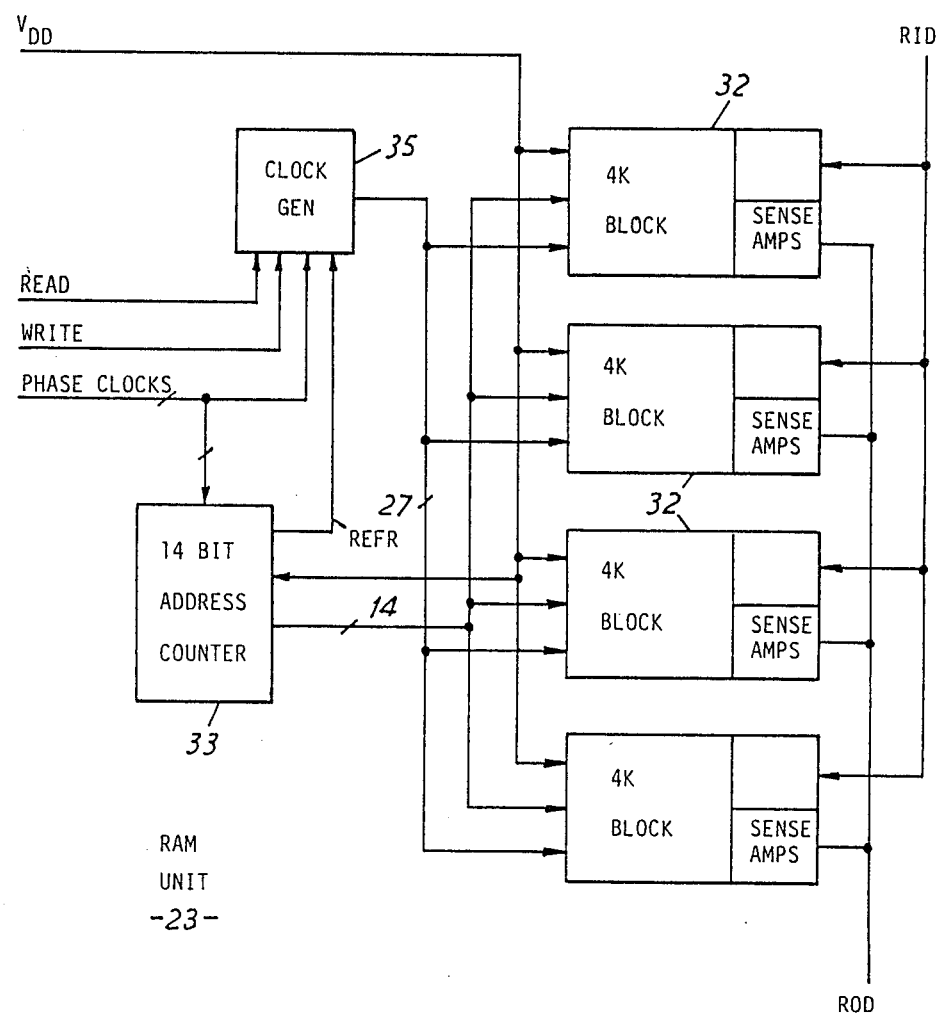
Figure 10:
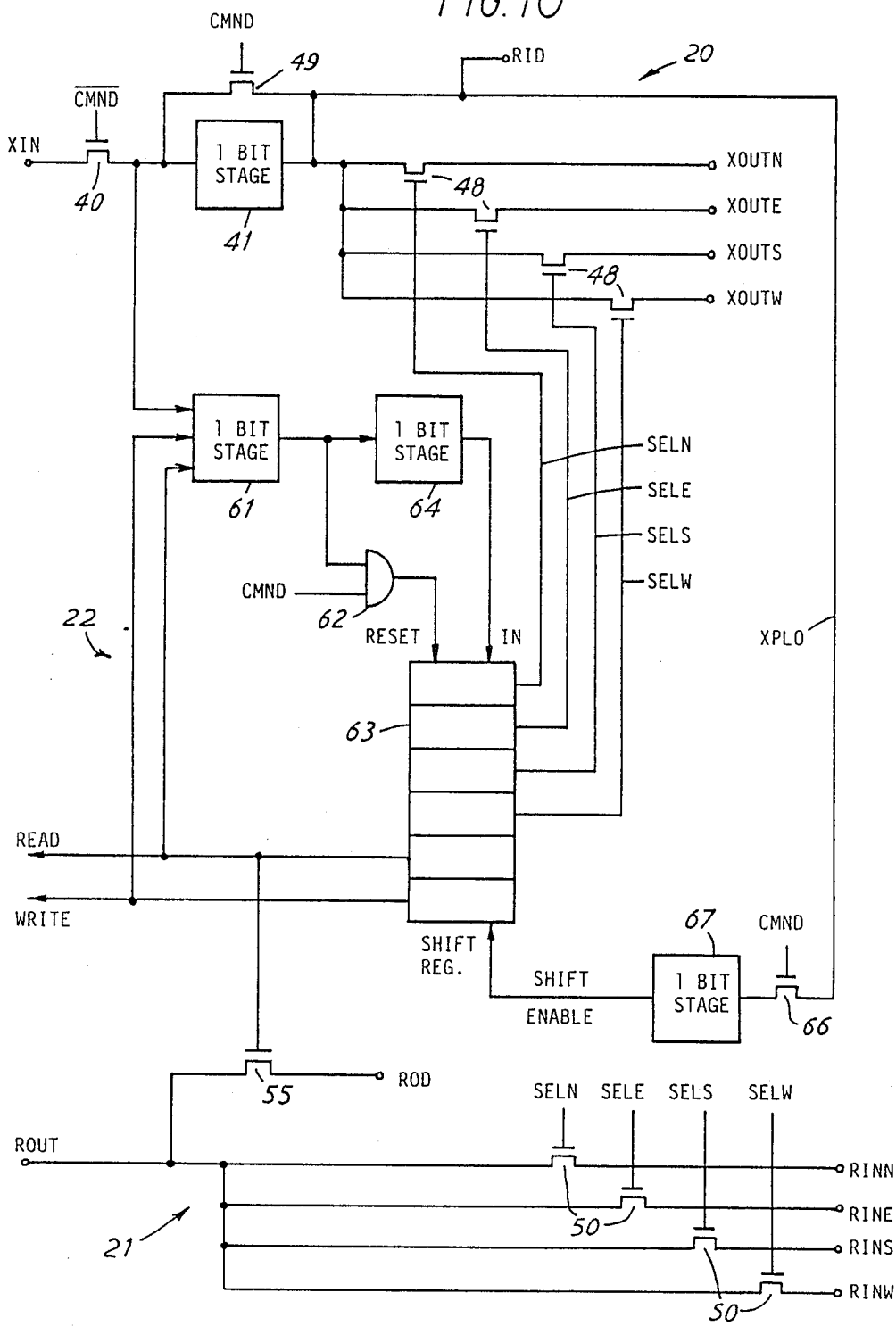
Figure 11:
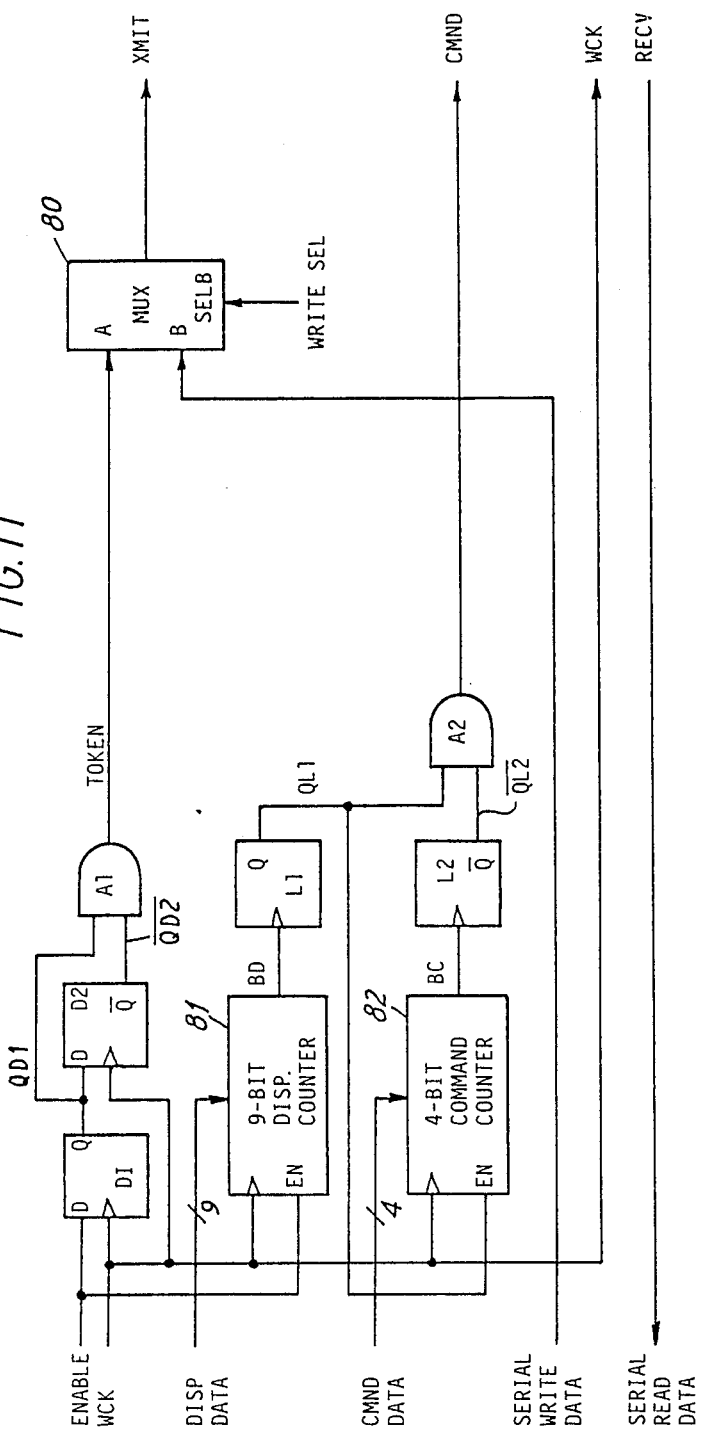
Figure 12:
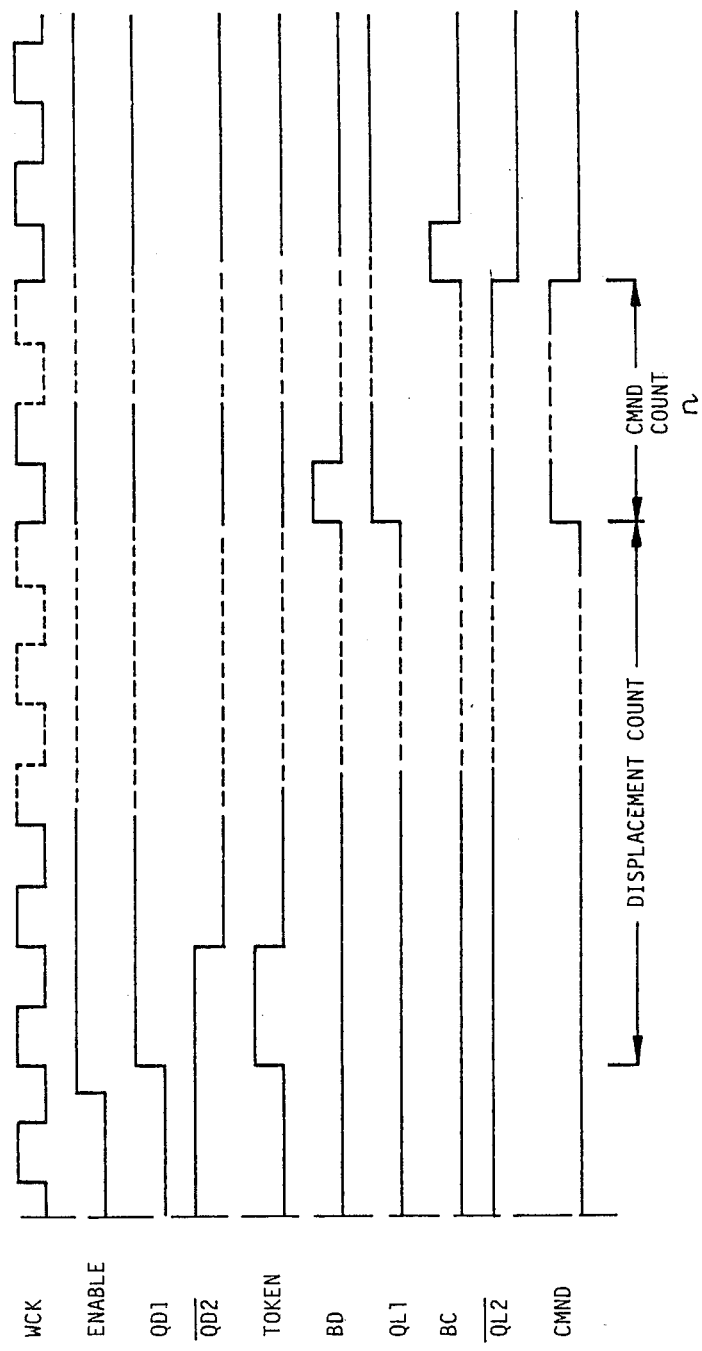
Figure 13:
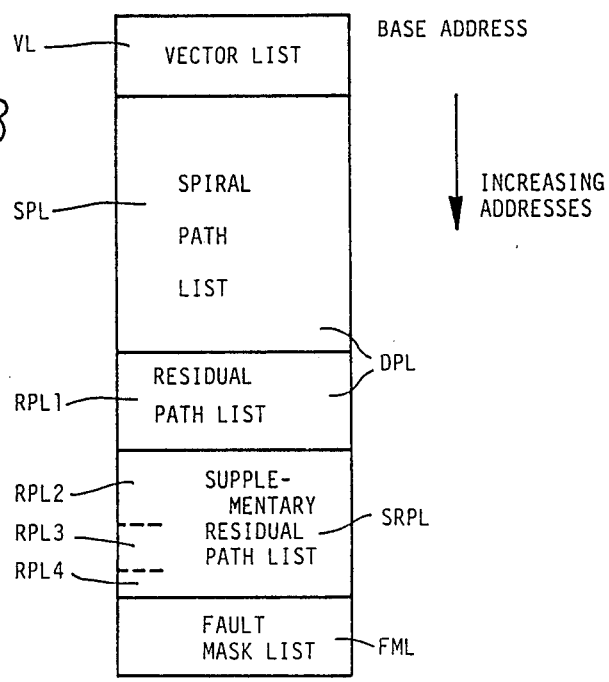
Figure 14:
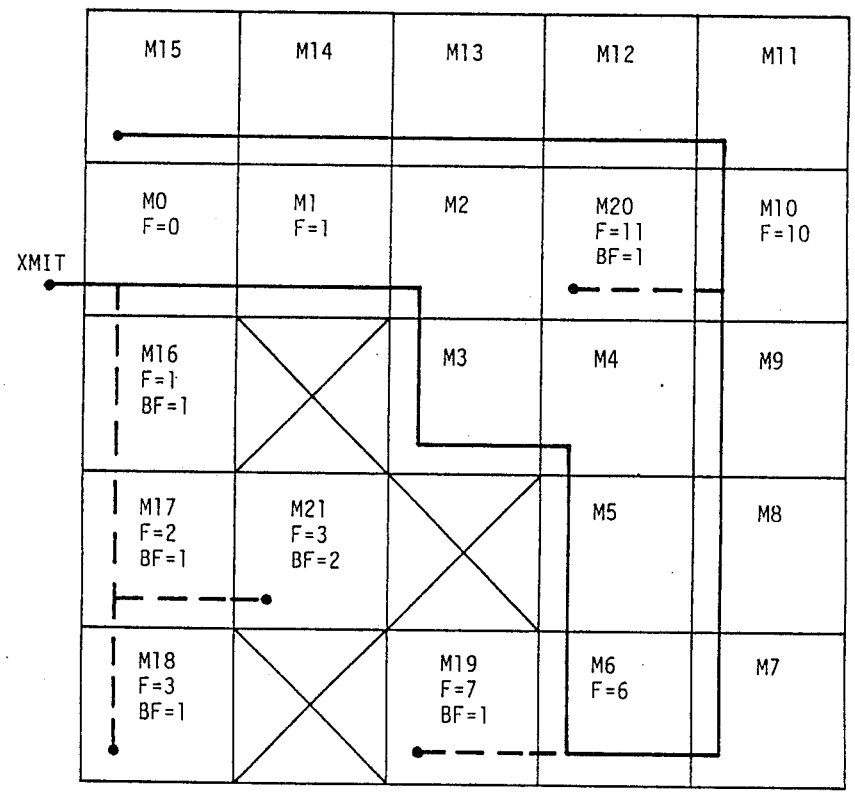

The invention will be described in more detail, by way of example, and with reference to the accompanying drawings, in which:

FIG. 1 is an explanatory diagram showing how defective regions of a RAM can be identified, FIG. 2 is a general block diagram of a simple embodiment of the invention, FIG. 3 is a more detailed block diagram of a fault masking circuit of FIG. 2, FIG. 3A is a block diagram of a simplified fault masking circuit, FIG. 4 shows part of a WSI circuit including global lines, FIG. 5 shows part of a WSI circuit but shows the transmit path inter-module lines, FIG. 6 is similar to FIG. 5 but shows the receive path intermodule lines, FIG. 7 illustrates how a chain of modules is formed at the edge of a wafer, FIG. 8 is a general block diagram of a module, FIG. 9 is a block diagram of a memory unit forming the function unit of a module, FIG. 10 is a circuit diagram of the transmit and receive path logic and the configuration logic of a module, FIG. 11 is a block diagram of a circuit for sending commands to modules, FIG. 12 shows explanatory waveforms pertaining to FIG. 11, FIG. 13 illustrates the structure of a control PROM, FIG. 14 is a diagram of a grown spiral of modules used in explaining how the contents of the PROM are determined, and FIG. 15 shows the start of the PROM in more detail.

FIG. 1 takes, by way of a simple example, a 16k bit RAM 10 addressed by a 7-bit column address and a 7-bit row address. Such a RAM can be treated like a shift register by addressing it with a free-running 14-bit counter and it is assumed that the bottom half of the counter provides the column address while the top half provides the row address.

A single cell 11 in the RAM 10 can be identified by its row and column addresses which can be treated as a row offset RO and a column offset CO relative to the address origin. An alternative way to identify the cell 11 is by a simple number, which is given by $RO*2^7+CO$, specifying how many clock pulses distant the cell is from the origin.

There are various ways in which a general rectangular area 12 of cells can be identified. That which will be employed in an embodiment of the invention to be described below is to specify the origin of the area by its RO and CO values and to specify in addition the row extent RE and the column extent CE.

In passing it may be noted that an area 13 extending across all rows could be specified solely by its column offset and column extent and an area 14 extending across all columns could be specified solely by its row offset and row extent. Such areas can also be specified fully by the set of four values RO, RE, CO, CE. It may be appropriate to identify areas of this kind it there are track faults disabling whole rows or columns of cells.

FIG. 2 shows a simple arrangement in which the invention is employed. The RAM 10 is associated with a computer 15 which has its own RAM and ROM memory and uses the RAM 10 as external memory, e.g. as a silicon disk. Naturally there may be other peripheral devices (not shown). The computer 15 communicates with the RAM via a bus 16 and a serial/parallel converter 17. For simplicity, an 8-bit bus 16 is assumed. The RAM 10 has a line RID (read in data) on which it can accept serial data. This is connected to SERIAL OUT of the converter 17. Similarly a RAM line ROD (read out data) is connected to SERIAL IN. The computer can pass a READ command or a WRITE command to the RAM. This could be done by way of chip select and read/write lines as in conventional technology or in a way explained below in relation to a wafer-scale embodiment.

The RAM is addressed by a free-running 14-bit address counter 18 and the computer 15 knows the time at which this counter passes from full count to zero count, the datum point in the count cycle. The way in which this relationship is achieved will be explained below. The counter 18 is driven by a clock signal WCK which is also applied to a fault masking circuit 19 to be described in detail below. This circuit 19 controls the application of the clock pulses to the CK terminal of the converter 17 so that faulty RAM areas are skipped over. The clock pulses passed by the circuit 19 will be called gated clock pulses GCK. They are additionally applied to a divide-by-8 counter 20 whose output is applied to a terminal PLL of the converter 17 to stroke the byte transfers to or from the bus 16. The computer also provides a signal to a terminal DIR to determine the direction of transfer-serial to parallel (read operation) or parallel to serial (write operation). The byte clock pulses BCK from the counter 20 must naturally be used to stroke the data transfers to or from the computer. Conventional techniques (e.g. DMA techniques) can be used in this respect.

Nominally, a 16k ($2^{14}=16384$) block of data can be transferred in a read or write operation, during the time taken for the counter 18 to complete a full count cycle. In practice the block is shorter than this, because of the times when GCK is interrupted by the circuit 19.

FIG. 3 is a block diagram of one embodiment of the circuit 19 designed to mask out one area of defective cells in the RAM 10. The circuit is composed of various AND gates, set/reset flip-flops, registers and counters. Input and output terminals of the registers and counters are designated as follows:

CK=Clock
EN=Enable
PL=Parallel load
CLR=Clear
TC=Terminal count.

The bus 16 is shown connected to the registers and certain of the counters for loading values therein. Chip selection is symbolized by lines branching from the bus to PL terminals. In practice conventional address decoding and strobe circuits will be used to determine which register or counter is loaded at any given time.

Circuit structure is readily apparent from FIG. 3 and a description of the operation will give a full understanding. When the computer wishes to read or write from the RAM 10 it first loads the values of RO, RE, CO and CE (FIG. 1) into a RO counter 21, a RE counter 22, a CO register 23 and a CE register 24. It also loads a delay value into a delay counter 25, whose purpose will be explained below. All values thus loaded are complementary so that a count from the loaded value to terminal counter represents the desired value. The computer then issues an ENABLE signal which clears a 14-bit block counter 26 and enables the delay counter 25 to count WCK.

When the delay counter 25 reaches terminal count it enables the 14-bit block counter 26 which issues a row count pulse RC off its 7th stage at the end of every RAM row. Also a flip-flop 27 is set to enable an AND gate 28. This gate passes WCK as GCK applied to the converter 17 and the counter 20.

The row pulses RC are counted by the RO counter 21 which reaches its terminal count at the beginning of the row containing the origin of the area 12 (FIG. 1) which is to be masked out, and stays locked in this state.

A CO counter 29 is loaded from the CO register 23 on the occurrence of RC at the end of every line and then always counts WCK. When it reaches its terminal count and the RO counter 21 is also at terminal count, an AND gate 30 allows a flip-flop 31 to be set, thereby removing an enabling input from the AND gate 28. Accordingly, so long as the flip-flop 31 remains set, WCK pulses are blocked from the gated clock signal GCK.

A CE counter 32 is also loaded from the CE register 24 on the occurrence of RC at the end of every line. When the flip-flop 31 is set (Q is true) the CE counter is enabled and counts WCK. On reaching terminal count it resets the flip-flop 31 and the Q BAR output of this flip-flop re-enables the gate 28. The gate 28 is therefore disabled in each successive line (starting from RO) for the interval from CO up to CO+CE. However the RE counter 22 counts the RC row pulses, once the RE counter has reached its terminal count, and when the RE counter reaches its terminal count it holds this state and disabled the AND gate 30 so that the flip-flop 31 can no longer be set.

The overall effect is to mask out the WCK pulses from GCK during the rectangular area 12 (FIG. 1) defined by RO, RE, CO, CE.

The circuit described with reference to FIG. 3 could readily be simplified to handle a single defective cell such as the cell 11 in FIG. 1. The CE and RE register and counters 24, 32, 22 would be superfluous, as would the CO register 23. The RO and CO counters 21 and 29 would be loaded from the computer bus 16 and a single WCK pulse would be masked out of GCK when the CO counter 29 first reached terminal count after the RO counter 21 had reached terminal count.

FIG. 3A shows the essentials of another simplified circuit. A 14-bit start counter 90 is loaded with the start address of the RAM cells to be masked while a second, range counter 91 is loaded with the range or extent of the cells to be masked. ENABLE (cf FIGS. 2 and 11) is gated with ENABLE FAULT MASK, which is simply a signal whereby the fault-masking facility can be turned on and off. The gated signal enables the start counter 90. When this reaches terminal count, it sets a flip-flop 91, whereby the output of a NAND gate 93 goes false to disable the gate G1 providing GCK as in FIG. 2. The flip-flop 92 moreover enables the counter 91 which, on reaching terminal count, sets another flip-flop 94 whose Q BAR output forms the second input to the NAND gate 93. The output of this gate reverts to true to re-enable the gate G1.

The simple circuit will be efficient for masking faulty areas of one or more cells confined to one or a few adjacent rows-area 14 in FIG. 1. It is not suitable for an area 12 or a column fault 13.

Given the teaching of FIG. 3 and FIG. 3A it is possible to design a system of counters to mark off any desired RAM area to be masked by masking out WCK pulses from GCK. It is furthermore apparent that the precise circuitry employed can be modified without changing the principle of operation.

The circuit of FIG. 3 can handle masking of a single area such as the area 12 in FIG. 1. It is necessary to consider the possibility that a RAM may have a plurality of faulty areas and/or faulty cells. The extent to which fault masking circuitry is provided to deal with a plurality of faulty areas of cells will depend upon the statistics of fault appearances and the cost of the masking circuits. Among the possibilities for masking multiple faults are the following:

It would be possible, when the RE counter 22 reached terminal count to stop WCK, have the computer load new RO, RE, CO and CE values and start WCK running again. The new RO value would be computed not from the origin but from the row address existing when WCK was stopped.

A problem with this approach is that, although there is no difficulty in stopping WCK so far as FIG. 2 is concerned, in the WSI system to be described below it is highly desirable for WCK, the wafer clock distributed to all modules on the wafer, to be uninterrupted.

A faster alternative would be to queue the new values in hardware stacks so that they could be loaded rapidly into the relevant registers and counters, without stopping WCK. This could be expensive to implement and run into timing problems.

An approach which appears to be more favourable is to provide a plurality of masking circuits operating in parallel. The AND gate 28 would have an input from each masking circuit so that any one circuit would be capable of independently masking out WCK pulses from GCK. The provision of a plurality of masking circuits would not be too great an overhead in the case of a WSI memory incorporating many RAM modules, say a few hundred RAM modules. The masking circuits would serve all RAM modules, i.e. they would be set up with the appropriate RO, RE, CO and CE values for whichever RAM module is being accessed, as will be described below. For example, a significant improvement in usable RAM modules might be achieved using a single general masking circuit as in FIG. 3 and a single simplified circuit for dealing with an isolated cell exhibiting a fault at a high refresh rate. However, an analysis of the likely incidence of faults in a large WSI system leads to the conclusion that it is desirable to provide one circuit as in FIG. 3, possibly simplified to cater only for column defects (i.e. RO always O and RE always $2^7$ for the size of RAM considered by way of example), plus two simplified circuits, one capable of dealing with an isolated faulty cell and another capable of dealing with a row fault.

An embodiment of the invention for a WSI memory will now be described. Firstly an outline will be given of the main features of a WSI memory system, further details of which can be found in published British patent applications GB 2 177 825, GB 2 178 204 and GB 2 181 870.

FIG. 4 shows a few modules 10 on a wafer. There may be a few hundred modules on the wafer. The modules are set in a grid of global lines, namely a $V_{DD}$ power line 11, a $V_{SS}$ power line 12, a WCK (wafer clock) line 13 and a CMND (command) line 14. All these lines go to bondsites on the edge of the wafer or WCK and CMND may go to a command module on the wafer.

FIG. 5 shows the same modules 10 minus the global lines but with inter-module lines 15 for transmit paths. Data may be sent through a chain of modules, starting at a bondsite identified as XMIT (transmit; not shown). The modules have four connections into their XMIT path and these connections are identified as follows:

| | |
|---|---|
| XINN | from module above |
| XINE | from module to right |
| XINS | from module below |

-continued

| | |
|---|---|
| XINW | from module to left |

As shown in the right hand module only, these XIN lines merge into a single XIN terminal.

The modules have four connections out from their XMIT paths and these connections are identified as follows:

| | |
|---|---|
| XOUTN | to module above |
| XOUTE | to module to right |
| XOUTS | to module below |
| XOUTW | to module to left. |

Unlike the XIN lines, these output lines are switched, so that a module can select only one of its edge neighbours as the next module in the chain, on to which XMIT data is passed.

The modules are also connected by receive return path intermodule lines 16 (FIG. 6) which follow data to be sent back to a bondsite identified as RECV (not shown).

The modules have four connections into their RECV paths:

| | |
|---|---|
| RINN | from module above |
| RINE | from module to right |
| RINS | from module below |
| RINW | from module to left. |

These connections are switched in correspodence with the XOUT connections.

The modules have four connections out of their RECV paths:

| | |
|---|---|
| ROUTN | to module above |
| ROUTE | to module to right |
| ROUTS | to module below |
| ROUTW | to module to left. |

These connections branch, without switching, from a ROUT terminal, so that return data is broadcast to all four neighbours, only one of which will have been set up to receive it.

The XOUT and RIN selections are effected by four selection signals SELN, SELE, SELS and SELW, whose generation is explained below. Only one of these signals can be true. If SELN is true, for example, the module routes the XMIT path to the adjacent module above and accepts RECV data from that module.

The SEL signals of the modules may be set up basically as described in U.S. Pat. No. 3,913,072. Modules are added one by one to the chain, tested and retained if good, and the procedure is reiterated to grow a chain of interconnected modules. The chain tends to spiral in to the centre of the wafer in the case of a peripheral bondsite for XMIT and RECV. There may be a plurality of such bondsites, say four, to improve the chance of finding a good place to start the chain.

FIG. 7 illustrates a peripheral fragment 17 of a wafer with modules 10 and the bondsite terminals XMIT and RECV. Portions of the XMIT path and RECV path are shown in full and broken lines respectively, as they would be grown through modules in accordance with the algorithm that each module tries its selection options in the order SELN, SELE, SELS and SELW.

The first module M1 fails with SELN (there is no module above it) but succeeds with SELE, so adding M2 to the chain. M2 succeeds with SELN and adds M3. M3 fails with SELN but succeeds with SELE, to add M4. M5 succeeds with SELN to add M5, and so on. In the example shown all modules are good, at least so far as their control logic is concerned.

A module which is connected into an active chain normally acts as a link in the chain and outbound data and commands pass from XMIT through the XMIT path in the module with a 1-bit delay through each module. Inbound data returns to RECV through the RECV path in the module, also with a 1-bit delay through each module. Each module contains a 16k×1 bit dynamic unit which is constantly refreshed under control of a free-running address counter. The module also contains control logic which can respond to commands to effect SELN, SELE, SELS and SELW and to other commands of which the most important are READ and WRITE. When a module receives either of these commands, the chain is broken at that module and the RAM unit is written to in the case of WRITE and read from in the case of READ. Although the RAM unit is composed of random access blocks it is only addressed by the free running counter and treated as a 16k block of serial memory. In a READ operation, all 16k of the memory or part thereof is read out on to the RECV line. If the READ command is timed correctly in relation to the address counter cycle, the memory block will be read out correctly starting from address 0 and running through to address $(2^{14}-1)$. If the READ command is not thus timed, the data will be "wrapped round"-in an address order N, . . . , $(2^{14}-1)$, O, . . . , (N-1) where N is the address obtaining at the READ command. The data can be accepted in this order at RECV and then cyclically shifted to establish the correct address order.

In a WRITE operation 16k of data is written from XMIT into the RAM unit. The command and ensuing data must either be correctly timed in relation to the address counter cycle or must be prewrapped-round to match the address N at which the write starts, or this address must be noted for use in any subsequent read operation.

It may be preferred to wait and launch READ and WRITE commands at the correct times relative to the address counter cycles as the delay thereby incurred is less than the time taken to re-organize wrapped-round data by shifting.

After a read or a write operation, assuming that communication is then required to the subsequent modules, it is necessary to send the appropriate SEL command to the module to re-establish the chain. A more detailed description of a module will now be given with an explanation as to how the aforementioned facilities are provided and other features of the preferred embodiment.

FIG. 8 is a block diagram of one module. The four XIN terminals merge into XIN which forms the input to XMIT PATH LOGIC 20, within which the switching takes place to route the XMIT path to XOUTN, XOUTE, XOUTS or XOUTW. The four RIN terminals enter RECV PATH LOGIC 21 which selects one RIN terminal for connection to ROUT which branches to the four ROUT terminals.

XIN is also connected to CONFIG LOGIC 22 (configuration logic) which decodes commands and provides the above-mentioned selection signals SELN, SELE, etc., and other commands, including READ and WRITE commands for a RAM UNIT 23. The command line CMND is fed to a clocked buffer 24 which provides complementary signals CMND (designating command module) and $\overline{\text{CMND}}$ (designating "transmit mode"). Basically, in transmit mode the module acts simply as a link in the chain passing on both outward bound XMIT path data and inward bound RECV path data. In command mode the module detects whether a command token is present in its XMIT path logic and, if it is, decodes and obeys the command addressed thereto, i.e. timed to provide a token bit in that module when CMND goes true.

CMND, $\overline{\text{CMND}}$ and signals in general are gated with clock signals (described below) as is conventional in MOS circuits. For simplicity this design detail is ignored in the present description.

The function unit of the module is a 16k RAM UNIT 23. In the presence of WRITE, 16k of data from the XMIT PATH LOGIC 20 is written into the RAM UNIT via a line RID (RAM input data). In the presence of READ, 16k of data is passed to the RECV PATH LOGIC 21 via a line ROD (RAM output data).

A timing pulse generator 25 provides multiphase timing signals PHASE CLOCKS in response to WCK. Although PHASE CLOCKS are shown connected only to CON LOGIC 22, they are of course distributed to the module circuits generally.

A module has seven mutually exclusive states as follows:
SELN asserted (link to module above)
SELE asserted (link to modüle to right)
SELS asserted (link to module below)
SELW asserted (link to module to left)
READ asserted
WRITE asserted
RESET (none of the above asserted).

As shown in FIG. 9, the RAM UNIT 23 includes four 4k RAM blocks 32 and a free-running, 14 bit address counter 33 ($2^{14}$=16384). The RAM data inputs are connected to the common input line RID (RAM input data) which accepts data from the XMIT PATH LOGIC. The RAM sense amplifiers 34 are connected to the common output line ROD (RAM output data) which passes data to the RECV PATH LOGIC.

The detailed management of the RAMs is effected conventionally by a clock generator 35 which receives the PHASE CLOCKS, READ and WRITE and effects precharge, discharge, refresh and so on, in a manner which need not be described here. The counter 33 comprises a 7-bit column counter (least significant half) and a 7-bit row counter (most significant half). Every time a carry propagates from the column counter to the row counter, a signal REFR is given to the clock generator 35 and the currently addressed row is refreshed in well known manner. Thus refresh takes place every 128 ($2^7$) clock pulses and a cycle of 128×128 clock pulses is required to refresh all rows of the RAM blocks 32.

FIG. 10 shows the XMIT PATH LOGIC 20. XIN is connected through an FET 40 enabled by $\overline{\text{CMND}}$ to a clocked 1-bit stage 41, from which drive is provided to the XOUT lines. Each such line includes an FET 48 of which only one is enabled by the corresponding signal SELN, SELE, SELS or SELW.

When the module is merely being used as a link in the chain and $\overline{\text{CMND}}$ is accordingly asserted, XIN is connected to one of XOUTN, XOUTE, XOUTS, XOUTW through FET 40, 1-bit stage 41, and whichever of the FETs 48 is enabled.

When the module is writing data to the RAM UNIT 23, $\overline{\text{CMND}}$ is again asserted and the data passes through the FET 40 and 1-bit stage 41 to RID.

The output of the 1-bit stage 41 is fed back to the input of the stage through an FET 49 which is enabled by CMND to form a 1-bit latch which latches the bit therein at the time CMND is asserted. This output is XPLO (transmit path latch out), which is physically the same as RID. XPLO is what tells the CONFIG LOGIC 22 whether the module in question is addressed or not when CMND is asserted.

FIG. 10 shows the RECV PATH LOGIC 21. RINN, RINE, RINS and RINW are connected through respective FET's 50 to ROUT. The FETs 50 are enabled by SELN, SELE, SELS and SELW respectively.

In order to transfer data from the RAM UNIT 23 to the RECV path, ROD is connected to ROUT through an FET 55 enabled by READ.

The CONFIG LOGIC 22 will now be described. XIN is connected through the FET 40 enabled by $\overline{\text{CMND}}$ to a 1-bit stage 61. WRITE and READ are also connected to the stage 61 which performs an OR function. The output of the 1-bit stage 61 is gated in an AND gate 62 which CMND to provide RESET.

The operation of this part of the circuit is as follows. If, in transmit mode, XIN provides a 1-bit signal, it is buffered in the 1-bit stage 61. If CMND is asserted before the next clock pulse, the output of the AND gate 62 goes true to assert RESET.

The output of the 1-bit stage 61 is buffered for one more bit time by a stage 64 to provide a bit which is to be clocked down a shift register 63 so long as CMND is asserted and used as a token signifying a command to be asserted in accordance with the location of the token bit at the time CMND ceases. It should be noted that RESET can only be asserted and the token bit generated when (1) the transmit path latch 41 contains a 1-bit when CMND is asserted or (2) READ or WRITE is asserted when CMND is raised, irrespective of the contents of the transmit path latch. Case (1) represents the normal way of addressing a command to a module: asserting CMND at the time a 1-bit is present in the module on the XMIT path. Case (2) provides a means of aborting a WRITE or READ operation.

As explained above XPLO will be latched at 1 in an addressed chip. As shown in FIG. 10, XPLO is applied to a 1-bit stage 67 through an FET 66 enabled by CMND to provide SHIFT ENABLE which enables the abovementioned shift register 63 in order to clock the token bit along the register until CMND ceases to be asserted.

Detailed timing considerations are not entered into here but the general situation is that XPLO is one bit delayed relative to XIN and SHIFTS is a further bit delayed relative to XPLO. RESET is one bit delayed relative to CMND and the token bit is a further bit delayed. RESET is thus generated off the same bit as is latched to form XPLO and one bit later, this same bit appears as the token bit to be clocked along the shift register with SHIFT true.

The shift register 63 may consist of a chain of six clocked D-type flip-flops. The flip-flops provide SELN, SELE, SELS, SELW, READ and WRITE respectively. Assuming that the module in question is addressed it can be seen that these six flip-flops will first be cleared by RESET. Then the token will be clocked from flip-flop to flip-flop for as long as SHIFT ENABLE remains true. When SHIFT ENABLE becomes false, which is when CMND goes false, the token bit is latched in whichever flip-flop it has reached.

If a 1-bit is sent down the XMIT path and CMND is asserted in the period in which that bit enters a given module and is then held true for n clock periods, n=2 will cause the token to be latched in the first flip-flop (SELN), n=3 will cause the token to be latched in the second flip-flop (SELE) and so on.

Although a more sophisticated test procedure is described in GB 2 177 825, it is assumed here that the basic way in which the chain is grown is to address SELN to the module M(n), so as to open up to the module M(n+1) which is then tested by using WRITE followed by READ to see if it will successfully write a block of data and read it back. If the test fails, SELE is sent to M(n), the new M(n+1) is tested and so on.

FIG. 11 shows the control circuitry for controlling the addressing of the modules. This circuitry may be off the wafer and interfaces with a control processor i.e. the computer 15 of FIG. 2, which provides the necessary data and the strobe signal ENABLE which initiates a command operation. ENABLE is the same as in FIG. 2 except that ENABLE in FIG. 2 is gated so as to be provided only when a READ or WRITE command is sent.

When ENABLE goes true (see also FIG. 12) it generates a 1-bit TOKEN via flip-flops D1 and D2, whose outputs QD1 and $\overline{QD2}$ are shown in FIG. 12, and and AND gate A1. The TOKEN is applied to XMIT via a multiplexer 80. XMIT corresponds to RID in FIG. 2. ENABLE also enables (EN terminal) a 9-bit displacement counter 81 which is used to count the number of clock pulses to the module to be addressed. A 9-bit counter will handle a chain of up to 512 modules. The counter 81 will have been preset by the control processor with the correct initial value denoted DISPLACEMENT DATA and, when enabled, counts clock pulses WCK until a terminal count, signalled by BD, is reached. BD is latched in a latch L1 whose output QL1 enables a second counter 82 and also initiates CMND via an AND gate A2. The counter 82 is a 4-bit command counter preset in accordance with the desired duration of CMND by CMND DATA. When this counter reaches its terminal count BC a second latch L2 latches BC and the $\overline{QL2}$ output of this latch disables the gate A2, so terminating CMND. A 4-bit counter 82 suffices to set up all desired durations of CMND.

Although not illustrated, $\overline{QL2}$ may be used to reset the latches D1, D2, L1, L2 or a central reset mechanism can be used.

When a WRITE command is set up, the controlling processor must feed the serial data to XMIT after CMND has gone low again and in doing this it applies a signal WRITE SEL to the multiplexer 80 to connect SERIAL WRITE DATA to XMIT. SERIAL WRITE DATA corresponds to SERIAL OUT in FIG. 2. When a READ command is set up, the controlling processor must be ready to accept serial read data on SERIAL READ DATA (SERIAL IN in FIG. 2) from RECV (ROD IN FIG. 2) m clock pulses after the termination of CMND, where m corresponds to the displacement of the addressed module from RECV.

It is clear that paths may be set up and read or write operations performed as required by sending, in sequence, appropriate values of DISPLACEMENT DATA plus CMND DATA to the control circuit of FIG. 11. A refinement (not illustrated) lies in providing two displacement counters 81 and two command counters 82 to facilitate restoring the spiral after a read or write operation. The four counters are all loaded before an access is initiated. Then one pair of counters 81 and 82 is used to generate CMND for the read or write operation. Then the other pair of counters is used to generate CMND for restoring the spiral (using the value of D described below).

The form in which data is stored to enable each module to be accessed will now be explained. The example which is given allows access both to modules on a main spiral and to modules on spurs or "residual paths", as described in GB 2 181 870. The relevant data is stored in a PROM with a memory allocation as illustrated in FIG. 13. In order to match a conventional tabulation of data, FIG. 13 has the base address of the PROM at the top. FIG. 13 illustrates a PROM for use with a single masking circuit only.

The PROM is blown only after the wafer has been fully tested. Starting at its base address, the PROM comprises a vector list VL, a spiral path list SPL, a residual path list RPL1, a supplementary residual path list made up of blocks RPL2 to RPLn, illustrated with n=4, and a fault mast list (FML). SPL and RPL1 together form the data path list DPL.

SPL lists all the modules in the main spiral. Each entry includes the following items:

D: a number (e.g. 3 bits) defining the direction in which the module normally links on to the next module in the main spiral. The values for D as follows:
1=SELN
2=SELE
3=SELS
4=SELW
0=END OF CHAIN F: a number (e.g. 9 bits) defining the number of clock cycles distant from XMIT.

U: a single bit which is zero if the module has a usable function unit (RAM) but is one if the function unit is unusable and the module is merely used as a link in the chain. See GB 2 177 825 for more information as to the discriminations between modules on this basis.

R: a single bit which is zero for a module in the main spiral.

P: a single bit which is zero if the memory module is perfect but is one if the memory is imperfect but usable. When P is one it requires an access to the FML to get the data required to mask out the faulty cell or cell areas in the RAM.

RPL1 is a continuation of SPL and lists all the modules which are not on the main spiral, i.e. with the R bit set to one. The way in which M numbers are allocated to modules in spurs will be explained below. FIG. 14 is a diagrm with a main spiral in full lines and four spurs in broken lines, including a spur off a spur. Each module is inscribed with its M number, certain modules with their F numbers and spur modules with a BF number which specifies its branch factor, i.e. the number of branchings at nodal modules involved in reaching that module.

RPL2 lists information for all spur modules with BF=1 in M number order. The information consists of the F number for the modal module which has to be switched to access the spur in question, the required D number and an R bit which is zero if the nodule is on the accessed spur (i.e. if BF=1) but is one if BF is greater than 1 and further branching is needed.

Similarly RPL3 lists information for all spur modules with BF=2, up to RPLn which lists information for all spur modules with BF=n−1. For the example of FIG. 14, the maximum value of BF is 3 and so the supplementary residual path lists are just RPL2 and RPL3.

FML lists masking parameters for all modules. These parameters consist of the DELAY, RO, RE, CO and CE values which are to be entered into the corresponding registers and counters 25, 21, 22, 23 and 24 in FIG. 3 and possible one or more additional pairs of RO and CO values for simplified circuits used to mask out single faulty cells. If P=0 the entries for the module are irrelevant and may be set to all zero for example.

DELAY is provided as one means whereby the operation of the fault masking circuit can be correctly timed relative to the cycle of the address counter 33 within the RAM unit 23 and having regard to the propagation delays in the XMIT and RECV pathss (1 bit per module).

In order that the various entries in SPL and RPL1 etc may be accessed correctly, the vector list VL is set up as shown in FIG. 15 which represents the top part of FIG. 13 is more detail. The first entry in this block is a check sum, namely the complemented contents of the data in VL, DPL, SRPL and FML. CHK.SUM is formed when the PROM is blown and enables the reliability of the contents of the PROM to be checked at any time. A total sum of all the contents of all addresses, including CHK.SUM should equal zero. For these all D, R, U and P in the example given and may be 16 bits as a practical matter).

The next entry ST.FML gives the offset to the start of FML. The next entry ST. DPL gives the offset to the start of DPL, i.e. the address indicated as LBASE in FIG. 15. The remainder of VL consists of offsets relative to LBASE, namely ST. SPL, which is the start of SPL and is equal to zero, followed by ST. RPL1, ST. RPL2, etc and terminating with ST. SPL=0 again. SPL starts at LBASE with the data for module MO at DPL address zero, i.e. address relative to LBASE.

When it is desired to access a given module, the corresponding DPL entry is accessed and action is taken as follows in dependence upon the R, U and P bits in the entry:

| R | U | P | |
|---|---|---|---|
| 0 | 0 | 0 | Address the module for read or write |
| 0 | 1 | 0 | Skip the module: no memory present |
| 1 | 1 | 0 | Spur module but no memory present: skip |
| 1 | 0 | 0 | Access SRPL, then address the module for read or write |
| 0 | 1 | 0 | Access FML before addressing the module |
| 0 | 1 | 1 | Redundant condition (no memory present) |
| 1 | 1 | 1 | Redundant condition (no memory present) |
| 1 | 0 | 1 | Access FML, then SPRL before addressing the chip. |

The contents of the PROM for the example of FIG. 14 can be tabulated as follows:

TABLE 1

| | | | | |
|---|---|---|---|---|
| | CHK.SUM | | | |
| | ST.FML = 37 | | | |
| | ST.DPL = 7 | | | |
| | ST.SPL = 0 | | | |
| | ST.RPL1 = 16 | } VL | | |
| | ST.RPL2 = 22 | | | |
| | ST.RPL3 = 28 | | | |

| | MODULE NO. | DISTANCE | EXIT DIRN | ON SPIRAL? | |
|---|---|---|---|---|---|
| | M | F | D | R | |
| LBASE | 0 | 0 | 2 | 0 | |
| | 1 | 1 | 2 | 0 | |
| | 2 | 2 | 3 | 0 | |
| | 3 | 3 | 2 | 0 | |
| | 4 | 4 | 3 | 0 | |
| | 5 | 5 | 3 | 0 | |
| | 6 | 6 | 2 | 0 | |
| | 7 | 7 | 1 | 0 | |
| | 8 | 8 | 1 | 0 | |
| | 9 | 9 | 1 | 0 | |
| | 10 | 10 | 1 | 0 | |
| | 11 | 11 | 4 | 0 | |
| | 12 | 12 | 4 | 0 | |
| | 13 | 13 | 4 | 0 | |
| | 14 | 14 | 4 | 0 | |
| | 15 | 15 | 0 | 0 | |
| LBASE + 16 | 16 | 1 | 3 | 1 | |
| | 17 | 2 | 3 | 1 | |
| | 18 | 3 | 0 | 1 | RPL1 |
| | 19 | 7 | 0 | 1 | |
| | 20 | 11 | 0 | 1 | |
| | 21 | 3 | 0 | 1 | |
| LBASE + 22 | 16 | 0 | 3 | 0 | |
| | 17 | 0 | 3 | 0 | |
| | 18 | 0 | 3 | 0 | RPL2 |
| | 19 | 6 | 4 | 0 | |
| | 20 | 10 | 4 | 0 | |
| | 21 | 0 | 3 | 1 | |
| LBASE + 28 | 21 | 2 | 3 | 0 | RPL3 |

ST FML = LBASE + 29 = 7 + 29 = 36 relative to BASE addresses, including CHK.SUM should equal zero. For these purposes, each PROM address is treated as a single word (which must be at least 15 bits to cater for F, It should be noted that the PROM entries do not include the M numbers. They are given in Table 1 for convenience of understanding. The PROM entries store the values in the F, D and R columns, plus the U bit and P bit which are not shown in the Table.

Having regard to the foregoing description of FIGS. 10 to 12 it will be apparent how a module in the main spiral is accessed. The M number is used to access the PROM at ST.DPL+M to fetch the F and D data and the U, P and R bits. U is tested. If it is 1, an error is signalled-no memory present, Uf U=0, P is tested. If P=0 and if R also=0, it is possible to proceed immediately with a main spiral access to a perfect RAM module. The F value is used to determine DISPLACEMENT DATA (FIG. 11). CMND DATA is determined by whether the access is to READ or WRITE. After the required read or write operation has been completed, the same DISPLACEMENT DATA with CMND DATA determined by the D value from the PROM are used to restore the spiral.

However, if P=1, before the access is effected, the computer 15 executes a short program to read the relevant values from FML and load them into their registers and counters (FIG. 2). For example if there are just the five values required by FIG. 2, the program reads the PROM at ST.FML+(5* M) and loads the value thus read into the counter 25, reads the PROM at ST.FML+(5*M+1) and loads the value thus read into the counter 21, and so on. Then the F and D data are used as described above.

The operations to access a spur module are more complex but briefly, after the tests and possible actions determined by the U and P bits, when R=1, the F and D values are stored and RPL2 is accessed to ascertain the F number to the relevant focal module which is then switched to the direction specified by D in the RPL2 list. If R in this list is zero, the stored F and D values are retrieved to access the module for READ or WRITE and subsequent restoration of its exit connection. If R is one, it is necessary to move on to RPL2 before effecting the access.

The accessing algorithms are given fully in the aforementioned GB 2 177 825.

In the example described with reference to FIGS. 13 and 15, the PROM handles only one masking circuit and provides 5 words space in the FML for every RAM module, regardless of whether the module has P=0 or P=1. This is a satisfactory approach for a single masking circuit and only a few hundred modules but it becomes too wasteful of PROM space if there are more masking circuits and especially if the number of modules is large. It is pointless to provide PROM space if U=1 or if P=0. It becomes desirable to devise more efficient ways of arranging FML data. As one of many possible schemes, the following can be adopted using an 8-bit wide PROM.

Each SPL (and RPL entry) consists of 4 words, so that the data for Mn (the n'th module) is found at LBASE+4*Mn. The data for a module is as follows:
BYTE 0=D, U, R and PO where PO is equivalent to P discussed above.
BYTE 1=F
BYTE 2=FMVmsb, P1, P2, P3
BYTE 3=FMVlsb.

Bytes 2 and 3 will contain data only if PO=1. P1, P2 and P3 indicate whether the first, second third masking circuits respectively are required to operate when PO=1. FMVmsb and FMVlsb are the most and least significant parts of a 13-bit vector pointing to the start of the FM data for the module, when PO=1. Since there are individual pointers for the modules, each group of FM data can be as long as is necessary to cater for whichever of P1, P2 and P3 are 1. In fact it is possible to pack all necessary data into five bytes, even if P1, P2 and P3 are all 1. The column defect circuit requires 1 byte for CO and half a byte will suffice for CE. The row defect circuit requires 1 byte for RO and half a byte will suffice for RE. The circuit for a single cell requires 2 bytes for RO, CO. Simple format rules will enable the FM data to be unpacked to provide the values to be loaded into such of the defect circuits as have their P1, P2 or P3 bit set to 1.

The embodiments described above relates to a RAM 10 or 23 which is only 1 bit wide. There is no difficulty in applying the invention to RAM systems which are more than 1 bit wide, in general n bits wide. The serial transfer consists of a block of groups of n bits and the masking circuit or circuits inhibit the transfer of one or more groups of bits.

I claim:

1. A fault tolerant memory system comprising a random access memory serving a digital computer and addressed by a free-running address counter means counting first clock pulses to generate a cyclic sequence of memory addresses for serial transfer between the memory and the computer of a block of groups of bits, where each group of bits consists of n bits and n is 1 or a larger integer, an interface between the computer and the memory, the interface being responsive to second clock pulses to effect the transfer between the computer and the memory, characterized by storage means storing data identifying the address of at least one of said groups within the block, and control means utilizing the stored data to inhibit the transfer of the identified at least one group, and wherein the control means selectively gates the first clock pulses to provide the second clock pulses.

2. A system according to claim 1, characterised in that the control means inhibits the transfer of just one group of n bits and the corresponding stored data identifies the position of the group in the cycle of the address counter.

3. A system according to claim 1, characterised in that the control means inhibits the transfer of a plurality of sequential groups of n bits and the corresponding stored data identifies the position of the first such group in the cycle of the address counter and the number of groups in the said plurality.

4. A system according to claim 1, characterised in that the control means comprises a plurality of control circuits responsive to stored data corresponding thereto to inhibit the transfer of groups of n bits individual to the control circuits respectively.

5. A system according to claim 4, characterized in that the control circuits are capable of independently blocking first clock puses from the second clock pulses.

6. A system according to claim 1, wherein the address counter means comprise a counter which counts through the addresses in numerical order.

7. A system according to claim 6, characterised in that the memory is addressed by row and column coordinate addresses and the address counter provides lower and higher significance address portions, and in that the control means inhibits the transfer of one or more groups of bits in each of one of said rows and columns and the corresponding stored data identifies the position of the first group to be inhibited in the cycle of the lower signficance address portion of the address counter and the number of groups to be inhibited in each of one of said rows and columns.

8. A system according to claim 6, characterised in that the memory is addressed by row and column coordinate addresses and the address counter provides lower and higher significance address portions, and in that the control means inhibits the transfer of one or more groups of bits in each of a first one of said row and columns in each of a set of adjacent other ones of said rows and columns and the corresonding stored data identifies the position of the first group to be inhibited in the cycle of the lower significance address portion of the address counter and the number of groups to be inhibited in each of said first one of said rows and columns and further identifies the first member of said set and the number of said other ones of said rows and columns in the said set.

9. A system according to claim 6, characterised in that the control means comprises a plurality of counters, means for loading the counters in accordance with the stored data and logic controlling the counters for selectively enabling the counters to count synchronously with the address counter and to provide state signals whereby the transfer of the identified at least one group is inhibited.

10. A system according to claim 9, characterised by at least a first counter which counts up to a position in the cycle of the address counter specified by the stored data, and a second counter which thereupon counts a number of groups of n bits whose transfer is to be inhibited.

11. A system according to claim 1, characterised in that there is a plurality of random access memories individually selectable by the digital computer for transfer of a block of groups of n bits, and in that the storage means store tabulated data pertaining to the various memories.

12. A system according to claim 11, characterised in that the memories are comprised in a wafer scale integrated circuit and the clock pulses are wafer clock pulses distributed over the whole wafer.

13. A system according to claim 11, characterised in that each memory has its own free running address counter.

14. A system according to claim 11, characterised in that a single control means serves all memories.

15. A system according to claim 14, characterised in that the memories communicate with the computer via the interface and a serial path and the control means time the gating of the first clock pulses in accordance with the address cycle of the address counter pertaining to the selected memory and a propagation delay along the serial path between the selected memory and the interface.

* * * * *